United States Patent

Mochida

[11] Patent Number: 6,014,333
[45] Date of Patent: Jan. 11, 2000

[54] SEMICONDUCTIVE MEMORY DEVICE CAPABLE OF CARRYING OUT A WRITE-IN OPERATION AT A HIGH SPEED

[75] Inventor: Yoshifumi Mochida, Tokyo, Japan

[73] Assignee: NEC Corporation, Toyko, Japan

[21] Appl. No.: 09/179,098

[22] Filed: Oct. 27, 1998

[30] Foreign Application Priority Data

Oct. 27, 1997 [JP] Japan ................................. 9-293816

[51] Int. Cl.[7] .............................................. G11C 16/04
[52] U.S. Cl. .............................. 365/189.05; 365/230.06; 365/230.08; 365/233
[58] Field of Search ............................. 365/189.05, 194, 365/230.06, 230.08, 233

[56] References Cited

U.S. PATENT DOCUMENTS

| | | | |
|---|---|---|---|
| 5,088,062 | 2/1992 | Shikata | 365/189.05 |
| 5,291,447 | 3/1994 | Kodama | 365/190 |
| 5,309,395 | 5/1994 | Dickinson et al. | 365/189.05 |
| 5,473,565 | 12/1995 | Kusakari | 365/233 |
| 5,539,696 | 7/1996 | Patel | 365/189.05 |
| 5,659,507 | 8/1997 | Yabe et al. | 365/189.01 |
| 5,668,760 | 9/1997 | Hazen | 365/189.05 |
| 5,740,115 | 4/1998 | Ishibashi et al. | 365/233 |
| 5,784,331 | 7/1998 | Lysinger | 365/189.05 |
| 5,844,858 | 12/1998 | Kyung | 365/233 |

FOREIGN PATENT DOCUMENTS

61-148692  7/1986  Japan .
1-137492  5/1989  Japan .

*Primary Examiner*—Amir Zarabian
*Assistant Examiner*—Gene N. Auduong
*Attorney, Agent, or Firm*—McGinn & Gibb, P.C.

[57] ABSTRACT

A semiconductive memory device has a plurality of memory cells and writing data in a specific one of the memory cells in accordance with a write-in address. The semiconductive memory device comprises a control signal producing section for producing a plurality of control signals in accordance with a synchronous signal. The control signals have phases different from one another. A column selection signal producing section is responsive to the write-in address and the control signals for producing a plurality of column selection signals. A latch section is for latching the data as latched data in synchronism with the control signals. A write bus section supplies the latched data to the memory cells. A write-in section writes the latched data on the write bus means in the specific memory cell in accordance with the column selection signals.

20 Claims, 9 Drawing Sheets

SEMICONDUCTIVE MEMORY DEVICE CAPABLE OF CARRYING OUT A WRITE-IN OPERATION AT A HIGH SPEED

BACKGROUND OF THE INVENTION

This invention relates to a semiconductive memory device, and more particularly, to a write-in control for a synchronous semiconductive memory device.

In general, it is necessary to carry out read-out and write-in operations at a high speed in a semiconductive memory device in proportion to accelerating of central processing unit (CPU). In order to carry out the read-out and the write-in operations at the high speed in the semiconductive memory device, a conventional semiconductive memory device is disclosed in Japanese Patent Publication (JP-A) Tokkai Sho 61-148692 (148692/1986) and will be referred as a first conventional semiconductive memory device. The first conventional semiconductive memory device has an internal pipe-line structure. The first conventional semiconductive memory device divides a address access path into a plurality of stages on the read-out operation to carry out the read-out operation in a time division fashion, in order to shorten-an-cycle time. It is necessary to write data in a sense amplifier within a shortened cycle time on the write-in operation.

Another conventional semiconductive memory device is disclosed in Japanese Patent Publication (JP-A) Tokkai Hei 1-137492 (137492/1989) and will be referred as a second conventional semiconductive memory device. In order to shorten a write-in cycle time, the second conventional semiconductive memory device comprises a plurality of buffers which are arranged in parallel. The buffers are operated with different timings, respectively, in order to transfer in turn outputs of the buffers.

However, it is difficult to carry out the write-in operation at the high speed in each of the first and the second conventional semiconductive memory devices, as will be described later.

SUMMARY OF THE INVENTION

It is therefore an object of this invention to provide a semiconductive memory device capable of carrying out a write-in operation at a high speed.

Other objects of this invention will become clear as the description proceeds.

On describing the gist of this invention, it is possible to understand that a semiconductive memory device comprises a plurality of memory cells and writing data in a specific one of said memory cells in accordance with a write-in address.

According to this invention, the semiconductive memory device comprises (A) control signal producing means for producing a plurality of control signals in accordance with a synchronous signal, said control signals has phases different from one another, (B) column selection signal producing means responsive to said write-in address and said control signals for producing a plurality of column selection signals, (C) latch means for latching said data as latched data in synchronism with said control signals, (D) write bus means for supplying said latched data to said memory cells, and (E) write-in means for writing said latched data on said write bus means in said specific memory cell in accordance with said column selection signals.

DESCRIPTION OF THE PREFERRED EMBODIMENTS

Figure 1:
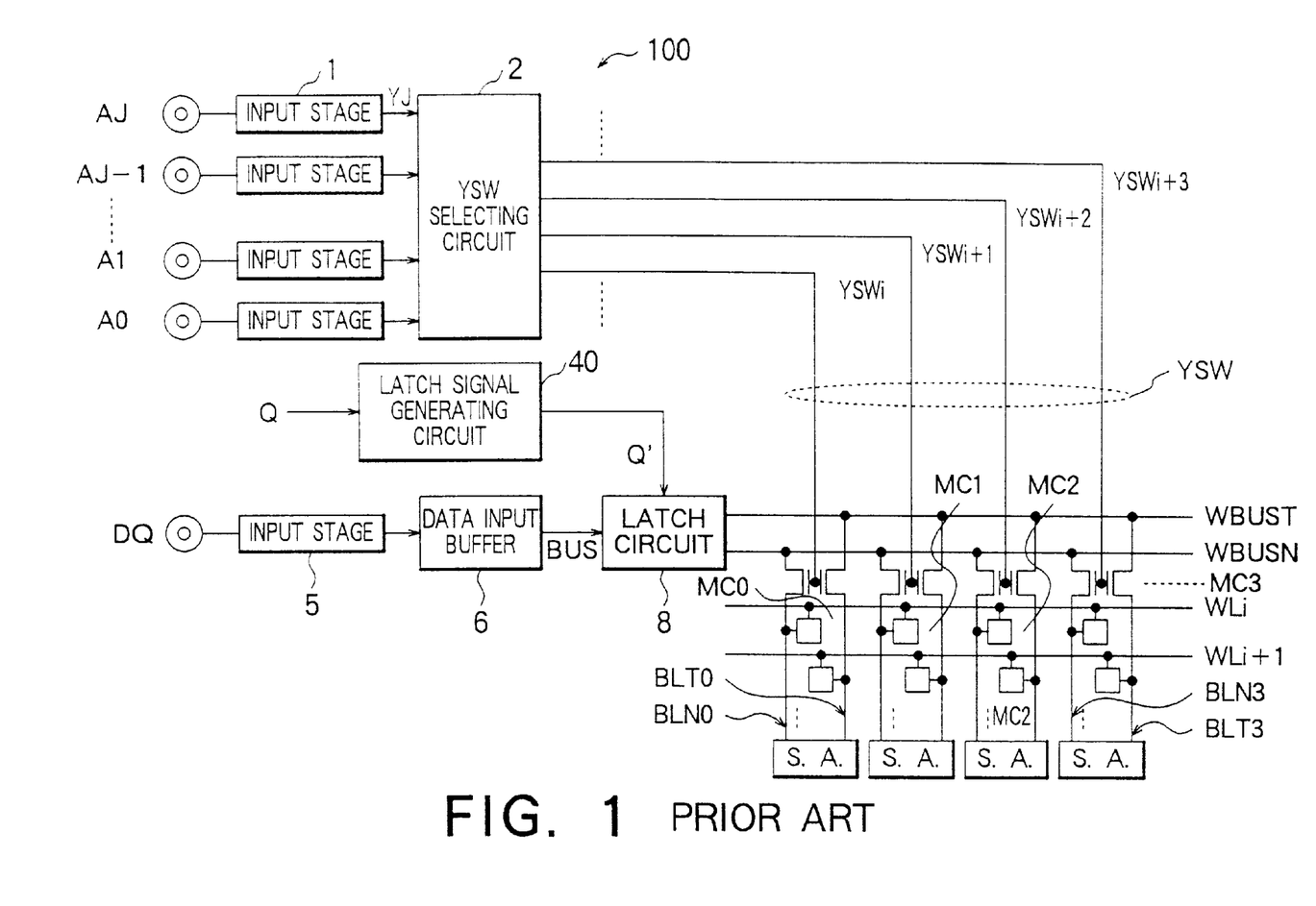
FIG. 1 is a circuit diagram of a first conventional semiconductive memory device.

Referring to FIG. 1, a first conventional semiconductive memory device will be described at first in order to facilitate an understanding of this invention. The illustrated semiconductive memory device 100 comprises zeroth through J-th input stages 1-0 to 1-J, where J represents a positive integer. The semiconductive memory device further comprises a YSW selecting circuit 2, a latch signal generating circuit 40, an additional input stage 5, a data input buffer 6, a latch circuit 8, and a plurality of bit line pairs BLT/N.

A j-th input stage 1-j is connected to a j-th address terminal Aj to be supplied with a j-th external address Aj, where j is a variable between zero and J, both inclusive. In response to the j-th external address Aj, the j-th input stage outputs a j-th address Yj. Supplied with the j-th address Yj, the YSW selecting circuit 2 produces a j-th YSW selecting signal, in order to select a j-th column section line YSW. The latch signal generating circuit 40 is supplied with a synchronous signal Q to output a latch signal Q'. The additional input stage 5 is supplied with data through a DQ terminal to deliver the data to the data input buffer 6. The data input buffer 6 buffers the data as buffered data to output the buffered data as write-in data on a data transmission line BUS. In accordance with the latch signal Q', the latch circuit 8 latches the write-in data as latched data to output the latched data on a write bus pair WBUST/N. Each of the bit line pairs BLT/N has a sense amplifier SA and is connected to the write bus pair WBUST/N through either one of the column selection lines YSW. Furthermore, each of the bit line pairs BLT/N is connected to a memory cell MC having a transistor and a capacitor.

Figure 2:
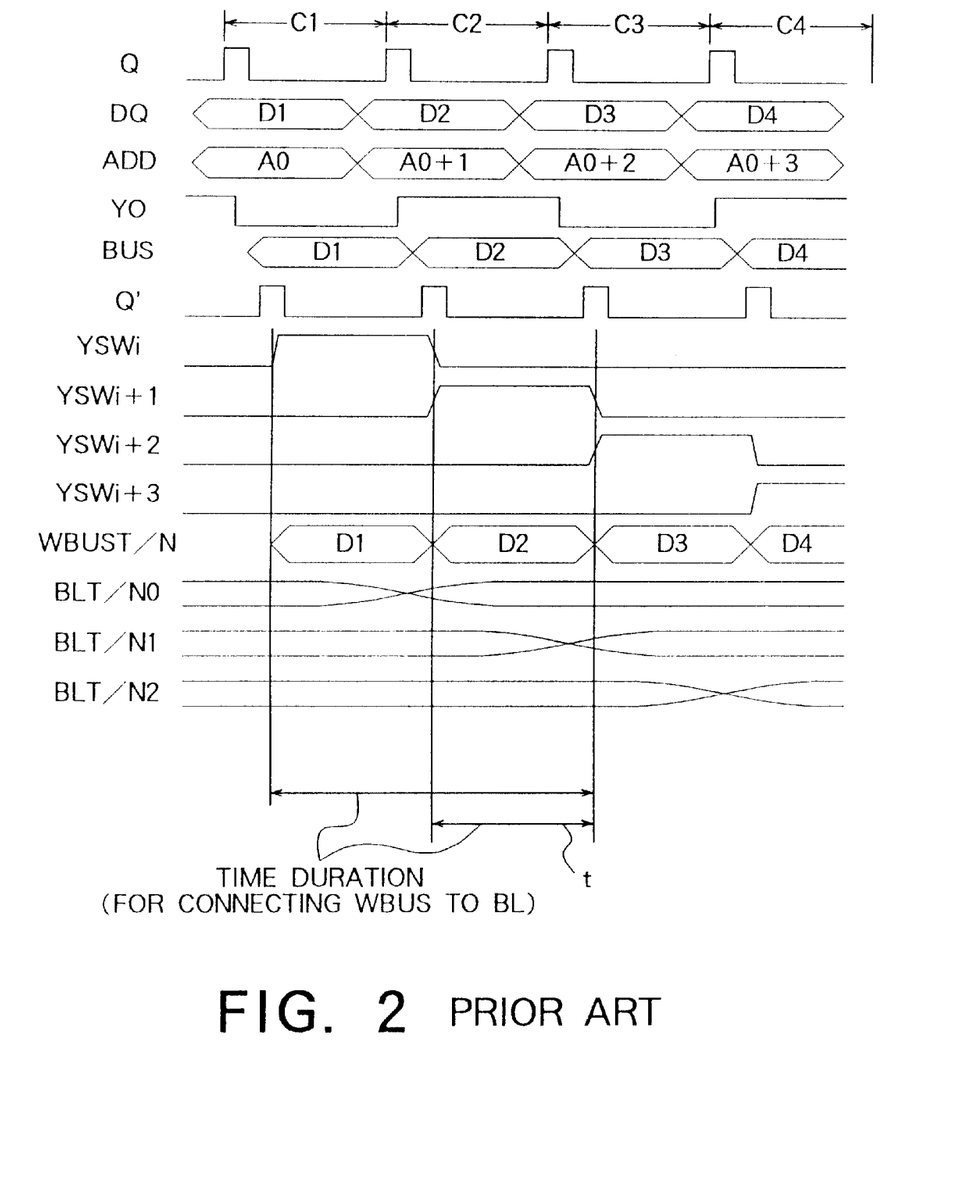
FIG. 2 is a wave diagram for describing operation of the first conventional semiconductive memory device illustrated in FIG. 1.

Referring to FIG. 2 in addition to FIG. 1, it will be assumed that the positive integer is equal to three. Furthermore, it will be assumed that the YSW selecting circuit 2 selects the column section lines YSWi, YSWi+1, YSWi+2, and YSWi+3 in accordance with the external addresses A0, A0+1, A0+2, and A0+3, respectively.

On writing external data D1, D2, D3, and D4 in the memory cells of addresses A0, A0+1, A0+2, and A0+3, respectively, at each lead edge of the synchronous signal Q the data input buffer 6 outputs the buffered data D1, D2, D3, and D4 on the data transmission line BUS, as described above. The latch circuit 8 latches the buffered data as the latched data D1, D2, D3, and D4 in accordance with the latch signal Q' to supply the latched data to the write bus pair WBUST/N.

As described above, the YSW selecting circuit 2 selects the column section lines YSWi, YSWi+1, YSWi+2, and YSWi+3 in accordance with the external addresses A0, A0+1, A0+2, and A0+3, respectively. When a high level appears on the column selection line YSWi, the bit line pair BLT/N is connected to the write bus pair WBUST/N in correspondence to the column selection line YSWi. As a result, the latched data are written in the memory cell MC whose word line WLi has a high level.

In the example being illustrated in FIG. 2, the write bus pair WBUST/N is connected to the bit line pairs BLT/N0, BLT/N1, BLT/N2, and BLT/N3, respectively, when the high level appears on the column section lines YSWi, YSWi+1, YSWi+2, and YSWi+3. The latched data D1, D2, D3, and D4 are written as write-in data in the memory cells MC0, MC1, MC2, and MC3, respectively.

Figure 3:
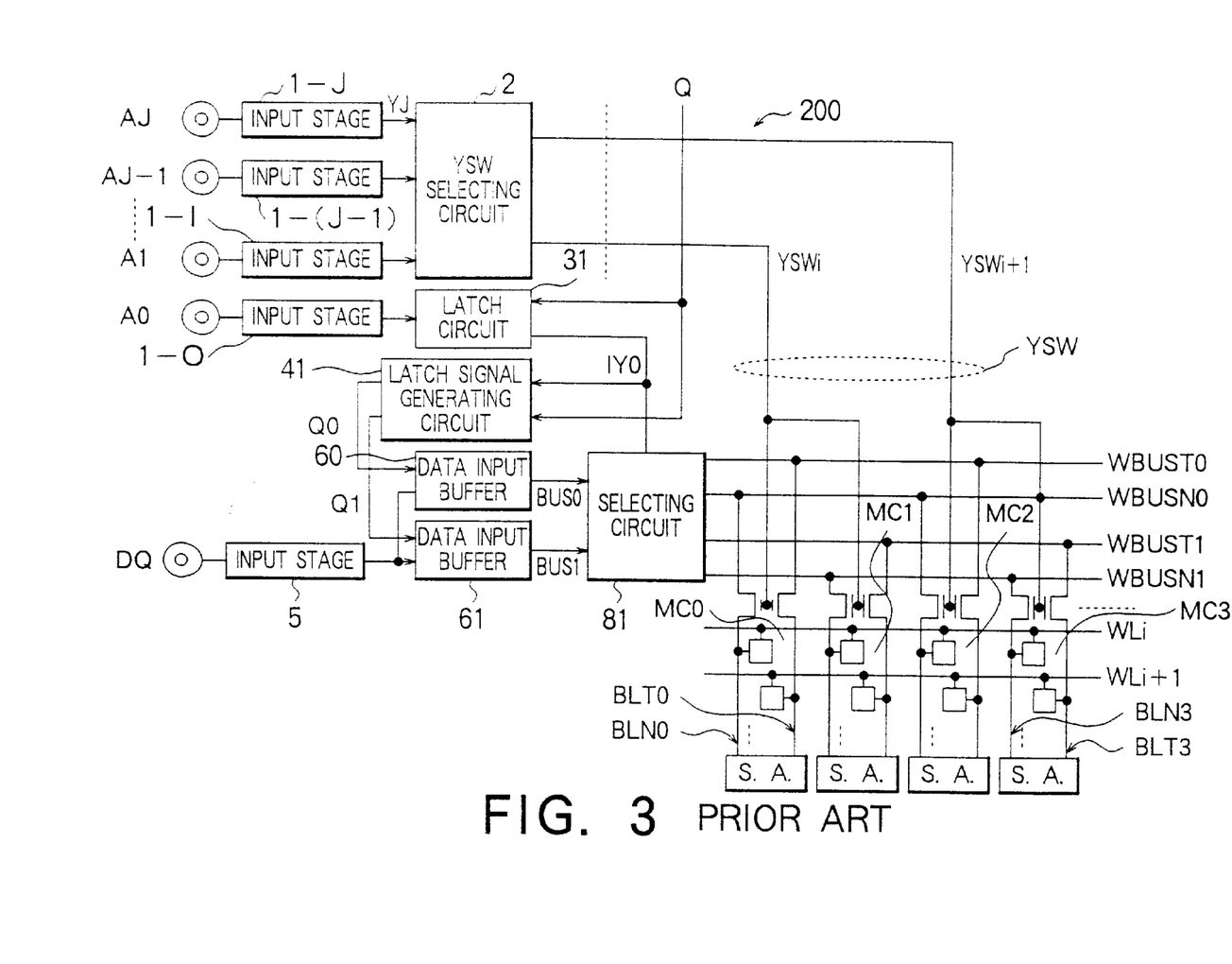
FIG. 3 is a circuit diagram of a second conventional semiconductive memory device.

Referring to FIG. 3, description will be made as regards a second conventional semiconductive memory device. The illustrated semiconductive memory device 200 comprises zeroth through J-th input stages 1-0 to 1-J, where J represents a positive integer. The semiconductive memory device further comprises a YSW selecting circuit 2, a latch circuit 31, a latch signal generating circuit 41, an additional input stage 5, a first data input buffer 60, a second data input buffer 61, a selecting circuit 81, and a plurality of bit line pairs BLT/N.

A j-th input stage 1-j is connected to a j-th address terminal Aj to be supplied with a j-th external address Aj, where j is a variable between zero and J, both of inclusive. In response to the j-th external address Aj, the j-th input stage outputs a j-th address Yj. Supplied with the first through the J-th addresses Y1 to YJ, the YSW selecting circuit 2 produces first through J-th YSW selecting signals, in order to select first through J-th column section lines YSW1 to YSWJ. The latch circuit 31 latches a zeroth address Y0 in accordance with a synchronous signal Q to produce a latched address as a output selection signal IY0. The latch signal generating circuit 41 is supplied with the synchronous signal Q to output first and second latch signals Q0 and Q1 on the basis of the output selection signal IY0. The additional input stage 5 is supplied with data through a DQ terminal to deliver the data to the first and the second data input buffer 60 and 61. The first data input buffer 60 buffers the data as first buffered data in accordance with the first latch signal Q0 to output the first buffered data on a data transmission line BUS0. The second data input buffer 61 buffers the data as second buffered data in accordance with the second latch signal Q1 to output the second buffered data on a data transmission line BUS1. In accordance with the output selection signal IY0, the selecting circuit 81 transfers the first and the second buffered data to a write bus pair WBUST/N0 and a write bus pair WBUST/N1, respectively. Each of the bit line pairs BLT/N has a sense amplifier SA and is connected to the write bus pair WBUST/N through either one of the column selection lines YSW. Furthermore, each of the bit line pairs BLT/N is connected to a memory cell MC having a transistor and a capacitor.

Figure 4:
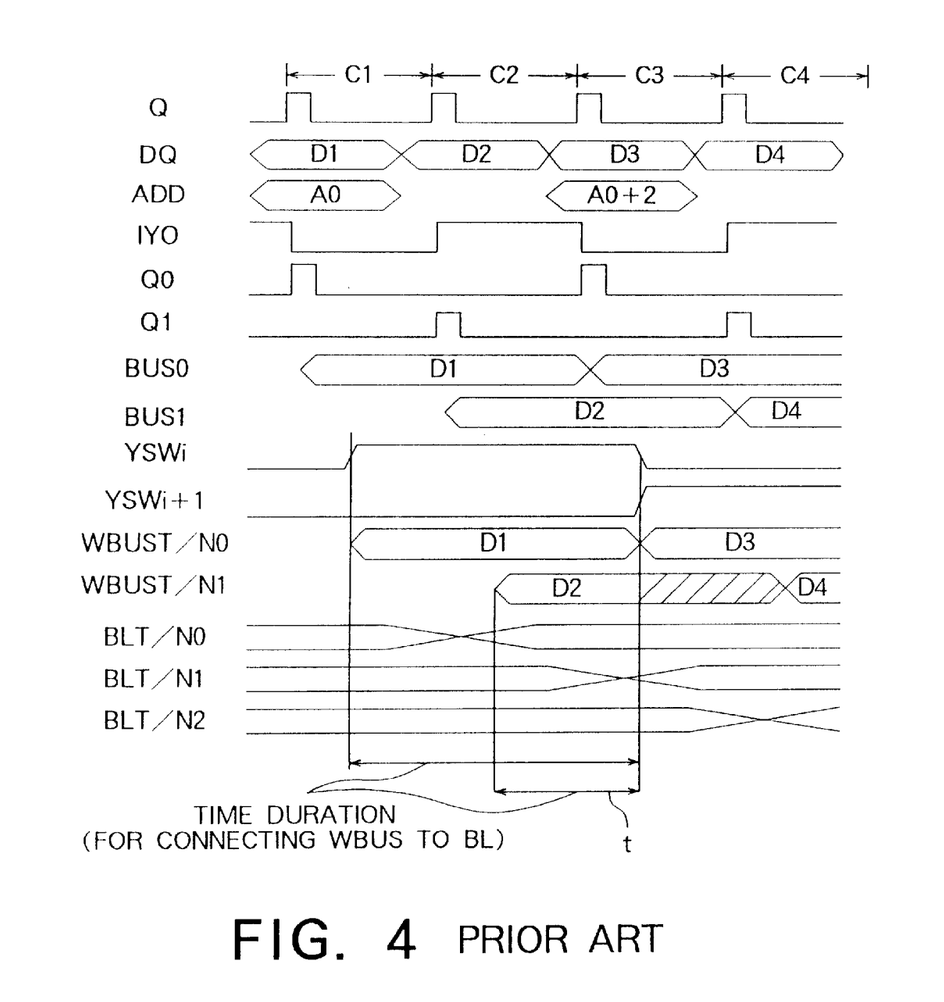
FIG. 4 is a wave diagram for describing operation of the second conventional semiconductive memory device illustrated in FIG. 3.

Referring to FIG. 4 in addition to FIG. 3, it will be assumed that the positive integer is equal to three. Furthermore, it will be assumed that the YSW selecting circuit 2 selects the column section lines YSWi and YSWi+1 in accordance with the external addresses A0+1, A0+2, and A0+3, respectively.

On writing external data D1, D2, D3, and D4 in the memory cells of addresses A0, A0+1, A0+2, and A0+3, respectively, at each leading edge of the synchronous signal Q, the output selection signal IY0 of the latch circuit 31 has a low level at each of cycles C1 and C3. The output selection signal IY0 has a high level at each of cycles C2 and C4. When the output selection signal IY0 has the low level, the latch signal generating circuit 41 outputs the first latch signal Q0 on the basis of the synchronous signal Q. When the output selection signal IY0 has the high level, the latch signal generating circuit 41 outputs the second latch signal Q1 on the basis of the synchronous signal Q. At a leading edge of the first latch signal Q0, the first data input buffer 60 outputs the first buffered data to the data transmission line BUS0. At a leading edge of the second latch signal Q1, the second data input buffer 61 outputs the second buffered data to the data transmission line BUS1.

When the output selection signal IY0 has the low level, the first buffered data on the data transmission line BUS0 is transferred to the write bus pair WBUST/N0. When output selection signal IY0 has the high level, the second buffered data on the data transmission line BUS1 is transfereed to the write bus pair WBUST/N1. In this event, the YSW selecting circuit 2 selects one of the column section lines YSWi and YSWi+1 in accordance with first through third adresses Y1 to Y3.

In the example being illustrated in FIG. 4, the column section lines YSWi, YSWi, YSWi+1, and YSWi+1 are selected in correspondence to the external addresses A0, A0+1, A0+2, and A0+3, respectively. When the high level appears on the column section line YSWi, the bit line pair BLT/N is connected to the write bus pair WBUST/N in correspondence to the column selection line YSWi. As a result, the data are written in the memory cell MC whose word line WLi has a high level.

In the example being illustrated in FIG. 4, the bit line pairs BLT/N0, BLT/N1, BLT/N2, and BLT/N3 are connected to the write bus pairs WBUST/N0, WBUST/N0, WBUST/N1, and WBUST/N1, respectively, when the high level appears on the column section line YSWi. The data D1, D2, D3, and D4 are written as write-in data in the memory cells MC0, MC1, MC2, and MC3, respectively.

As described above, the write bus pair is connected to the bit line when high level appears on the column section line. As a result, the data is written in the memory cell selected by word line. On the write-in operation, it is necessary to invert the data on the bit line while the high level appears on the column section line. If the low level appears on the the column section line before inversion, the data becomes an initial state by the sense amplifier connected to the bit line. Therefore, it is necessary to make the column section line be the high level during a minimum time duration t for inverting the data on the bit line.

In FIG. 1, the high level appears on the column section line during one cycle. Therefore, a write-in minimum cycle time becomes the minimum time duration t.

In FIG. 3, the data D1 are held on the write bus pair WBUST/N during two cycles. Therefore, the write-in minimum cycle time may become t/2.

By the way, the write bus WBUST/N1 is connected to the bit line BLT/N1 during one cycle inasmuch as transfer is carried out in connection to the data D2 on the write bus WBUST/N1 after one cycle laspes. In FIG. 4, half-tone dot meshing represents disconnection between the write bus WBUST/N1 and the bit line BLT/N1.

In case where the external address A0 is supplied to the semiconductive memory device in the cycle D1 and the external address A0+2 is supplied to the semiconductive memory device in the cycle D2, the column section line YSWi has the high level during only one cycle. In case where the external address A0 is a same address, the data is held during one cycle inasmuch as the data transmission line BUS0 and the write bus pair WBUST/N0 are common. At a next cycle, the data D2 is held during one cycle. Therefore, the write-in minimum cycle time becomes the minimum time duration t in FIG. 3.

As described above, the write-in minimum cycle time is determined by the minimum time duration t in each of the first and the second conventional semiconductive memory device. Therefore, it is difficult to carry out the write-in operation at a high speed greater than a predetermined speed determined by the minimum time duration t.

Figure 5:
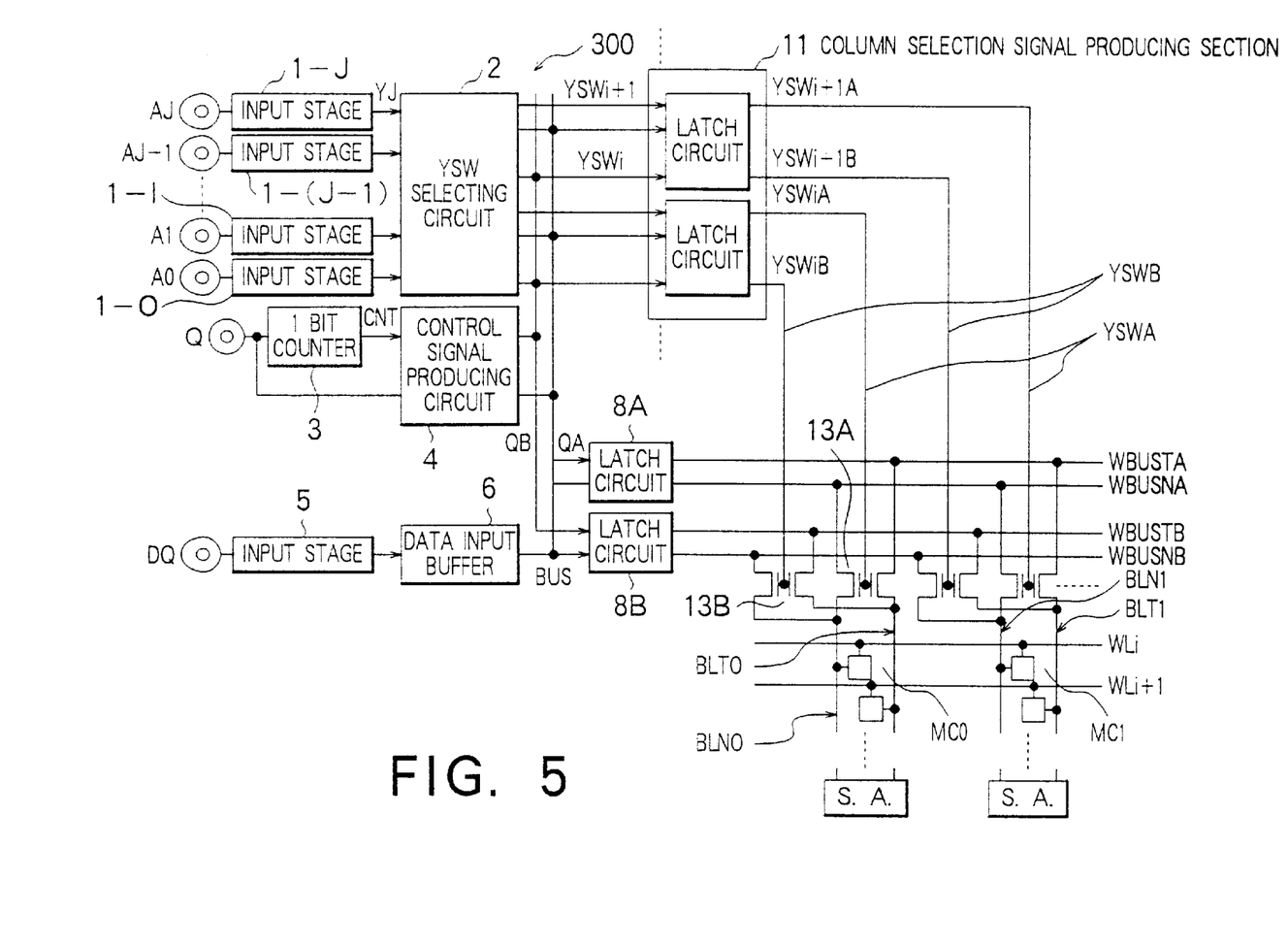
FIG. 5 is a circuit diagram of a semiconductive memory device according to a preferred embodiment of this invention.

Referring to FIG. 5, description will proceed to a semiconductive memory device according to a first embodiment of this invention. The illustrated semiconductive memory device 300 comprises zeroth through J-th input stages 1-0 to 1-J, where J represents a positive integer. The semiconductive memory device 300 comprises a YSW selecting circuit 2, a counter circuit 3, a control signal producing circuit 10, an additional input stage 5, a data input buffer 6, a column selection signal producing section 11, first and second latch circuits 8A and 8B, first and second switching circuits 13A and 13B, and a plurality of bit line pairs BLT/N0.

A j-th input stage 1-j is connected to a j-th address terminal Aj to be supplied with a j-th external address Aj, where j is a variable between zero and J, both inclusive. In response to the j-th external address Aj, the j-th input stage outputs a j-th address Yj. Supplied with the j-th address Yj, the YSW selecting circuit 2 produces a j-th YSW selecting signal, in order to select a j-th column section line YSW. In the example being illustrated, the YSW selecting circuit 2 produces the YSW selecting signals YSWi, YSWi+1, YSWi+2, and YSWi+3.

The counter circuit 3 carries out a count-up in accordance with a synchronous signal to produce a count signal CNT. The control signal producing circuit 10 is supplied with the synchronous signal Q and the count signal CNT to output first and the second control signals QA and QB on the basis of the count signal CNT. The control signals QA and QB have first and second phases different from each other. The additional input stage 5 is supplied with data through a DQ terminal to deliver the data to the data input buffer 6. The data input buffer 6 buffers the data as buffered data to output the buffered data on a data transmission line BUS.

The column selection signal producing section 11 has a plurality of latch circuits. In the example being illustrated, the column selection signal producing section 11 has four latch circuits although two latch circuits are illustrated in FIG. 5. The column selection signal producing section 11 is supplied with the YSW selecting signals YSWi, YSWi+1, YSWi+2, and YSWi+3. The column selection signal producing section 11 latches YSW selecting signals YSWi, YSWi+1, YSWi+2, and YSWi+3 in accordance with the first control signal QA to produce column selection signals YSWiA, YSWi+1A, YSWi+2A, and YSWi+3A. The column selection signal producing section 11 latches YSW selecting signals YSWi, YSWi+1, YSWi+2, and YSWi+3 in accordance with the second control signal QB to produce column selection signals YSWiB, YSWi+1B, YSWi+2B, and YSWi+3B.

In accordance with the first control signal QA, the first latch circuit 8A latches the buffered data as first latched data to output the first latched data on a write bus pair WBUST/NA. In accordance with the second control signal QB, the second latch circuit 8B latches the buffered data as second latched data to output the second latched data on a write bus pair WBUST/NB.

The bit line pairs BLT/N0 has a sense amplifier SA and is connected to the write bus pair WBUST/NA through the first switching circuit 13A. The bit line pairs BLT/N0 is connected to the write bus pair WBUST/NB through second switching circuit 13B. Furthermore, the bit line pairs BLT/N0 is connected to a memory cell MC0 having a transistor and a capacitor. The first and the second switching circuits 13A and 13B is controlled by the column selection signals. In the example being illustrated, the semiconductive memory device has four sense amplifiers SA, four switching circuits 13A, and four switching circuits 13B, although two sense amplifiers SA, two switching circuits 13A, and only two switching circuits 13B are illustrated in FIG. 5.

Figure 6:
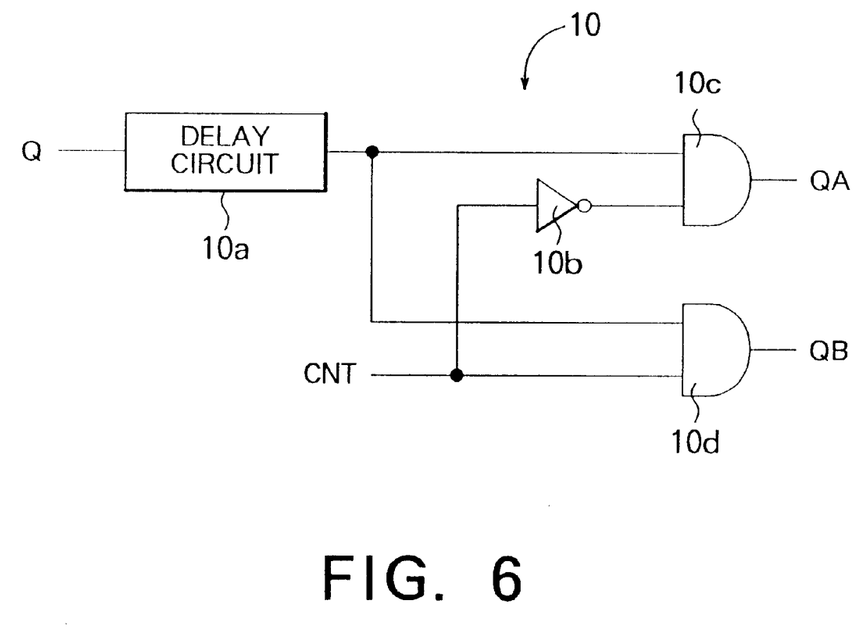
FIG. 6 is a circuit diagram of an example of a control signal producing circuit used in the semiconductive memory device illustrated in FIG. 5.

Referring to FIG. 6, the control signal producing circuit 10 comprises a delay circuit 10a, an inverter circuit 10b, and first and second AND circuits 10c and 10d. The delay circuit 10a is supplied with the synchronous signal Q. The delay circuit 10a gives the synchronous signal Q a predetermined delay to produce a delayed signal. The delayed signal is delivered to the first and the second AND circuits 10c and 10d. The second AND circuit 10d is supplied with the count signal CNT and carries out a logical multiplication between the delayed signal and the count signal CNT to produce the second control signal QB. The count signal CNT is supplied to the inverter circuit 10b to be inverted into an inverted signal which is delivered to the first AND circuit 10c. The first AND circuit 10c carries out a logical multiplication between the delayed signal and the inverted signal to produce the first control signal QA.

As readily understood from the above description, the control signal producing circuit 10 produces the first control signal QA when the count signal CNT has a low level. When the count signal CNT has a high level, the control signal producing circuit 10 produces the second control signal QB. The control signal producing circuit 10 and the counter circuit 3 collectively serves as a control signal producing section.

Figure 7:
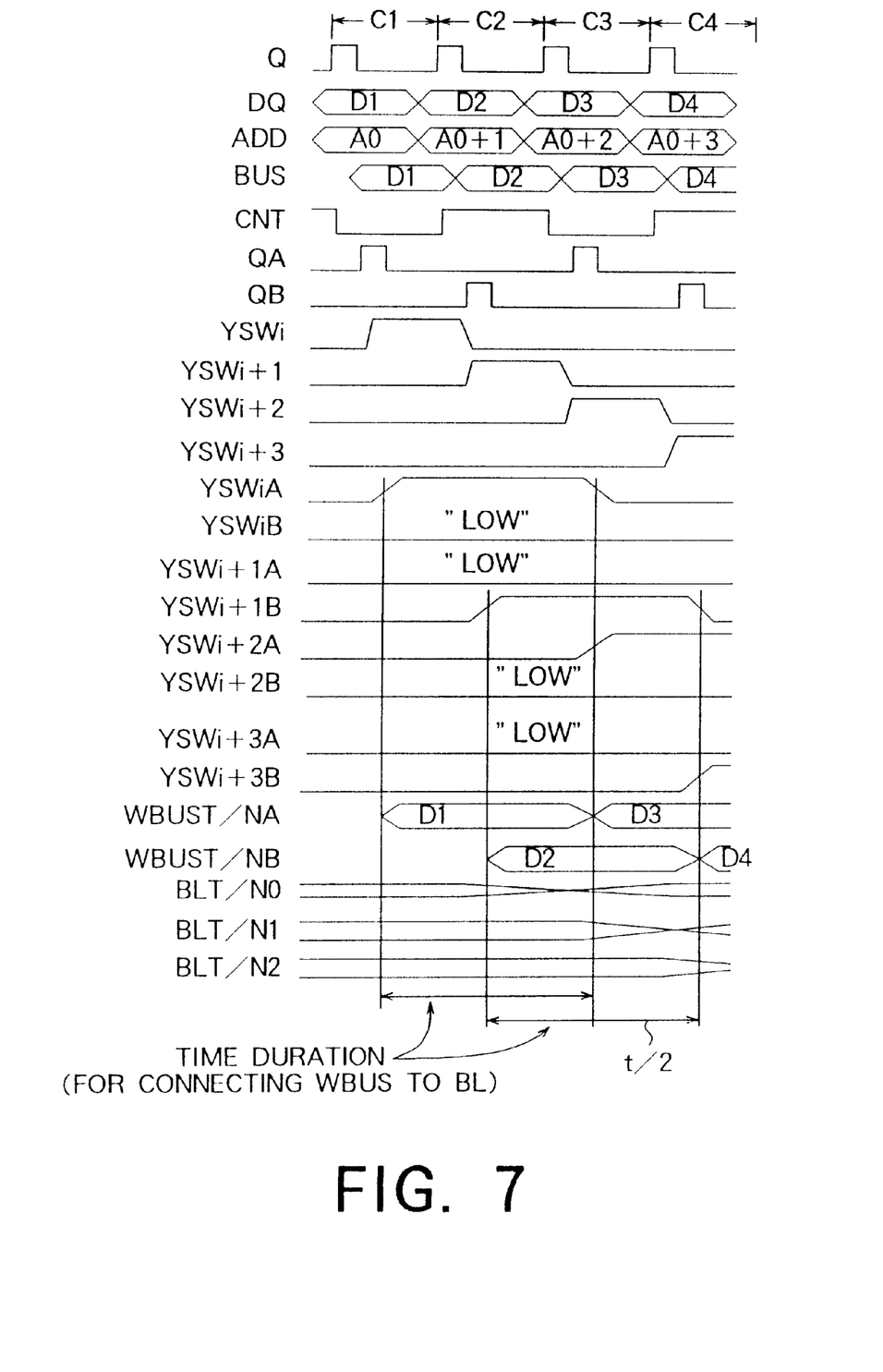
FIG. 7 is a wave diagram for describing operation of the semiconductive memory device illustrated in FIG. 5.

Referring to FIG. 7 in addition to FIG. 5, it will be assumed that the positive integer J is equal to three. On writing external data D1, D2, D3, and D4 in the memory cells of addresses A0, A0+1, A0+2, and A0+3, respectively, at each lead edge of the synchronous signal Φ, the data input buffer 6 outputs the buffered data D1, D2, D3, and D4 on the data transmission line BUS. The counter circuit 3 carries out the count-up in accordance with the leading edge of the synchronous signal. The count signal CNT has levels in no concern with the external addresses.

In the example being illustrated in FIG. 7, the count signal CNT has a low level during each of cycles C1 and C3. The count signal CNT has a high level during each of cycles C2 and C4. Therefore, the control signal producing circuit 10 produces the first control signal QA during each of the cycles C1 and C3. During each of the cycles C2 and C4, the control signal producing circuit 10 produces the second control signal QB. At the cycle C1, the buffered data D1 is latched in the first latch circuit 8A in accordance with the first control signal QA to be transmitted to the write bus pair WBUST/NA. At the cycle C2, the buffered data D2 is latched in the second latch circuit 8B in accordance with the second control signal QB to be transmitted to the write bus pair WBUST/NB. Inasmuch as the first control signal QA has the low level in the cycle C2, the buffered data D1 is held on the write bus pair WBUST/NA.

At the cycle C3, the buffered data D3 on the data transmission line BUS is transferred to the write bus pair WBUST/NA in accordance with the first control signal QA. As a result, the buffered data D3 appears on the write bus pair WBUST/NA. At that time, the write bus pair WBUST/NB holds the buffered data D2. Inasmuch as each of the first and the second control signals QA and QB is produced every two cycles, the data are held on the each of the write bus pairs WBUST/NA and WBUST/NB during two cycles.

In FIG. 7, the YSW selecting circuit 2 selects the column selection lines YSWi, YSWi+1, YSWi+2, and YSWi+3 in accordance with the external addresses A0, A0+1, A0+2, and A0+3, respectively. At the cycle C1, the column selection signal producing circuit 11 is supplied with the column selection signal YSWi. The column selection signal producing circuit 11 produces the column selection signal YSWiA in accordance with the first control signal QA. Therefore, the column selection line YSWiA becomes the high level. Inasmuch as the second control signal QB is not supplied to the column selection signal producing circuit 11, the column selection line YSWiB has the low level.

At the cycle C2, the column selection signal producing circuit 11 is supplied with the column selection signal YSWi+1. The column selection signal producing circuit 11 selects the column select ion line YSWi+1B in accordance with the second control signal QB. At that time, the first control signal QA has the low level. Therefore, the column selection line YSWiA has the high level.

At the cycle C3, the column selection signal producing circuit 11 is supplied with the column selection signal YSWi+2. The column selection signal producing circuit 11 selects the column selection line YSWi+2A in accordance with the first control signal QA. At that time, the column selection signal YSWi has the low level. Therefore, the column selection line YSWiA is not selected. Inasmuch as the second control signal QB has the low level, the column selection line YSWi+1B has the high level.

As readily understood from the above description, each of the column selection lines has the high level during two cycles inasmuch as each of the first and the second control signals QA and QB is produced every two cycles. When the column selection line YSWiA has the high level, the bit line pair BLT/N selected by the column selection line YSWiA is connected to the write bus pair WBUST/NA. The data are written in the memory cell MC whose word line WLi has the high level. When each of the column selection lines YSWi+1A, YSWi+2A, and YSWi+2A has the high level, the data are written in the memory cell MC whose word line WLi has the high level, in a similar manner. Similarly, the bit line pair BLT/N selected by the column selection line YSWiB is connected to the write bus pair WBUST/NB when the column selection line YSWiB has the high level. The data are written in the memory cell MC whose word line WLi has the high level. When each of the column selection lines YSWi+1B, YSWi+2B, and YSWi+3B has the high level, the data are written in the memory cell MC whose word line WLi has the high level, in a similar manner.

More particularly, the bit line pairs BLT/N0, BLT/N1, BLT/N2, and BLT/N3 are connected to the write bus pairs WBUST/NA, WBUST/NB, WBUST/NA, and WBUST/NB, respectively, when the column selection lines YSWiA, YSWi+1B, YSWi+2A, and YSWi+3B are selected by the column selection signal producing circuit 11. As a result, the write-in data D1, D2, D3, and D4 are written in the memory cells MC0, MC1, MC2, and MC3, respectively.

Figure 8:
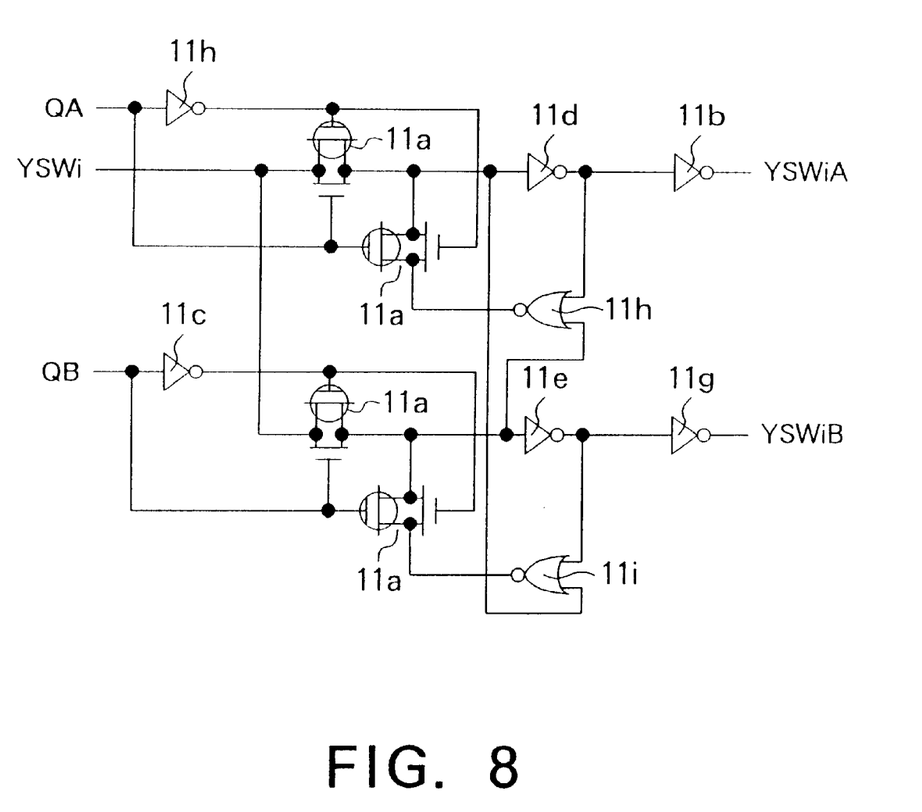
FIG. 8 is a circuit diagram of an example of a column selection signal producing circuit used in the semiconductive memory device illustrated in FIG. 5.

Referring to FIG. 8, description will proceed to an example of the column selection signal producing section 11. The column selection signal producing section 11 comprises a plurality of latch circuits as described in conjunction to FIG. 1. Each of the latch circuits in the column selection signal producing section 11 comprises a plurality of field effect transistors 11a. Furthermore, each of the latch circuits comprises first through sixth inverters 11b to 11g and first and second NOR circuits 11h and 11i.

Description will be directed to one of the latch circuits in the column selection signal producing section 12. The latch circuit is supplied with the column selection signal YSWi and the first and the second control signal QA and QB. Supplied with the column selection signal YSWi, the latch circuit selects the column selection line YSWiA when the first control signal QA has the high level. The latch circuit selects the column selection line YSWiB when the second control signal QB has the high level. The first NOR circuit 12h outputs a low level signal when the column selection line YSWiB is selected by the latch circuit. As a result, the column selection line YSWiA is not selected by the latch circuit.

When the column selection signals YSWi+1, YSWi+2, and YSWi+3 are supplied to the column selection signal producing section 12, the column selection signal producing section 11 selects the column selection lines YSWi+1A, YSWi+1B, YSWi+2A, YSWi+2B, YSWi+3A, and YSWi+3B in accordance with the first and the second control signal QA and QB, respectively.

Figure 9:
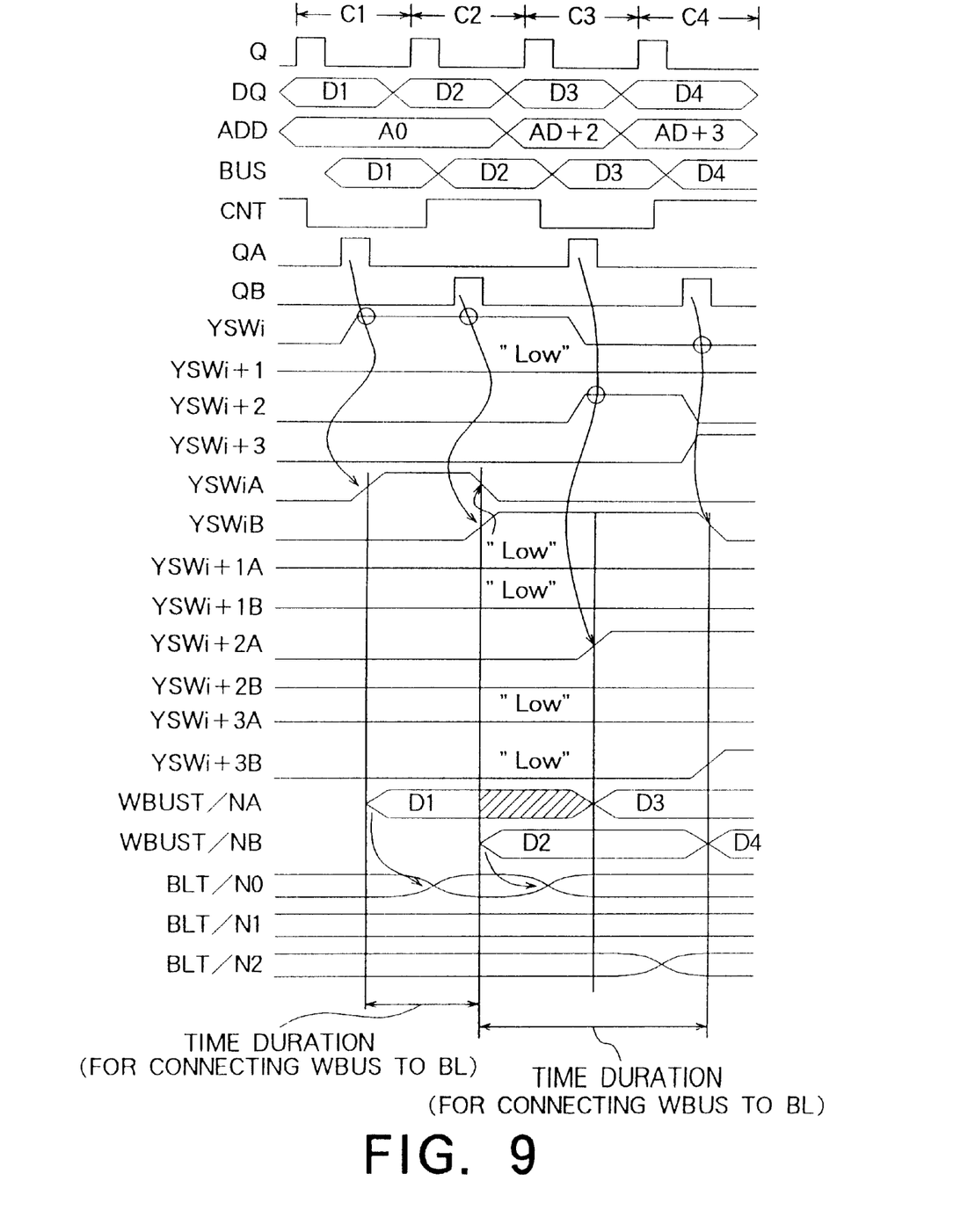
FIG. 9 is a wave diagram for describing operation of the semiconductive memory device which has the column selection signal producing circuit illustrated in FIG. 8.

Inasmuch as the column selection signal producing section 11 selects the column selection lines as described above, the write-in data are held during two cycles as shown in FIG. 9 in a similar manner described in conjunction to FIG. 3.

As readily understood from the above-mentioned embodiment, the data on the column selection line or the write bus pair are held during two cycles. During two cycles, the data are transferred to the bit line selected by the column selection line. Therefore, it is possible to make a clock frequency be twice in comparison with the conventional semiconductive memory device.

While this invention has thus far been described in conjunction with the preferred embodiment thereof, it will readily be possible for those skilled in the art to put this invention into practice in various other manners.

What is claimed is:

1. A semiconductive memory device comprising a plurality of memory cells and writing data in a specific one of said memory cells in accordance with a write-in address, comprising:

control signal producing means for producing a plurality of control signals in accordance with a synchronous signal, said control signals having phases different from one another;

column selection signal producing means that receives the control signals, the column selection signal producing means being responsive to said write-in address and said control signals for producing a plurality of column selection signals, the column selection signals being dependent on the control signals input to the column selection signal producing means;

latch means for latching said data as latched data in synchronism with said control signals;

write bus means for supplying said latched data to said memory cells; and write-in means for writing said latched data on said write bus means in said specific memory cell in accordance with said column selection signals.

2. A semiconductive memory device as claimed in claim 1, wherein said semiconductive memory device further comprises switching means positioned between said write bus means and said memory cells, said switching means being switched in accordance with said column selection signals.

3. A semiconductive memory device as claimed in claim 1, wherein said column selection signal producing means latches an input address signal based on said write-in address in accordance with said control signals to produce said column selection signals.

4. A semiconductive memory device as claimed in claim 1, wherein said write bus means has at least two write bus pairs.

5. A semiconductive memory device as claimed in claim 4, wherein said write bus means has first and second write bus pairs.

6. A semiconductive memory device as claimed in claim 5, wherein said control signal producing means produces first and second control signals in accordance with said synchronous signal.

7. A semiconductive memory device as claimed in claim 6, wherein:
said write-in means comprises first and second switching circuits which are switched on the basis of said column selection signals;
said first bus pair being connected to said memory cells through said first switching circuit; and
said second bus pair being connected to said memory cells through said second switching circuit.

8. A semiconductive memory device as claimed in claim 7, wherein:
said column selection signal producing means latches said input address signal in accordance with said first control signal to produce a first column selection signal, said column selection signal producing means latches said input address signal in accordance with said second control signal to produce a second column selection signal;
said first switching circuit being switched on the basis of said first column selection signal; and
said second switching circuit being switched on the basis of said second column selection signal.

9. A semiconductive memory device as claimed in claim 8, wherein said latched data are held on said either one of said first and said second write bus pairs during two cycles to be written in said specific memory cell.

10. A semiconductor memory device as claimed in claim 1, wherein said control signal producing means comprises a delay circuit that receives the synchronous signal and at least two circuit elements that receive an output signal from the delay circuit, the circuit elements outputting the plurality of control signals.

11. A semiconductive memory device comprising:
a plurality of memory cells capable of having data written into a specific one of said memory cells in accordance with a write-in address;
a control signal producing circuit that receives a synchronous signal and produces a plurality of control signals based on the synchronous signal, said control signals having phases different from one another;
a column selection signal producing device that receives the control signals and produces column selection signals based at least on the received control signals;
a latch device that latches said data as latched data in synchronism with said control signals; and
a write-in device that receives the latched data from the latch device and writes said latched data in said specific memory cell in accordance with said column selection signals.

12. A semiconductive memory device as claimed in claim 11, wherein said semiconductive memory device further comprises a switching circuit positioned between said latch device and said memory cells, said switching circuit switching in accordance with said column selection signals.

13. A semiconductive memory device as claimed in claim 11, wherein said column selection signal producing device latches an input address signal based on said write-in address in accordance with said control signals to produce said column selection signals.

14. A semiconductive memory device as claimed in claim 11, further comprising a first write bus and a second write bus, said first and second write buses supplying said latched data to the write-in device.

15. A semiconductive memory device as claimed in claim 14, wherein said control signal producing circuit produces first and second control signals in accordance with said synchronous signal.

16. A semiconductive memory device as claimed in claim 15, wherein:
said write-in device comprises first and second switching circuits which are switched on the basis of said column selection signals;
said first write bus being connected to said memory cells through said first switching circuit; and
said second write bus being connected to said memory cells through said second switching circuit.

17. A semiconductive memory device as claimed in claim 16, wherein:
said column selection signal producing device latches said input address signal in accordance with said first control signal to produce a first column selection signal, said column selection signal producing device latches said input address signal in accordance with said second control signal to produce a second column selection signal;
said first switching circuit being switched on the basis of said first column selection signal; and
said second switching circuit being switched on the basis of said second column selection signal.

18. A semiconductive memory device as claimed in claim 17, wherein said latched data are held on said either one of said first write bus and said second write bus during two cycles to be written in said specific memory cell.

19. A semiconductor device as claimed in claim 17, wherein said latched data is held on the column selection line for two cycles and during said two cycles the data is transferred to the bus selected by said column selection signal.

20. A semiconductor memory device as claimed in claim 11, wherein said control signal producing circuit comprises a delay circuit that receives the synchronous signal and at least two circuit elements that receive an output signal from the delay circuit, the circuit elements outputting the plurality of control signals.

* * * * *